(12) United States Patent
Novellini

(10) Patent No.: US 11,637,645 B1
(45) Date of Patent: Apr. 25, 2023

(54) METHOD FOR TIME STAMPING WITH INCREASED ACCURACY

(71) Applicant: XILINX, INC., San Jose, CA (US)

(72) Inventor: Paolo Novellini, Gorgonzola (IT)

(73) Assignee: XILINX, INC., San Jose, CA (US)

( * ) Notice: Subject to any disclaimer, the term of this patent is extended or adjusted under 35 U.S.C. 154(b) by 105 days.

(21) Appl. No.: 17/026,115

(22) Filed: Sep. 18, 2020

(51) Int. Cl.
H04J 3/06 (2006.01)
H04L 7/00 (2006.01)

(52) U.S. Cl.
CPC .......... H04J 3/0661 (2013.01); H04L 7/0037 (2013.01)

(58) Field of Classification Search
CPC .............................. H04J 3/0661; H04L 7/0037
USPC ........................ 370/464, 498, 503
See application file for complete search history.

(56) References Cited

U.S. PATENT DOCUMENTS

| 6,839,879 | B1 | 1/2005 | Hwang |
| 7,492,780 | B1 | 2/2009 | Goolsby |
| 9,167,058 | B2 | 10/2015 | Gresham et al. |
| 9,331,724 | B2 | 5/2016 | Novellini et al. |
| 10,291,501 | B1 | 5/2019 | Novellini et al. |
| 2006/0222016 | A1* | 10/2006 | Noel ............. H04J 3/0664 370/503 |
| 2010/0086091 | A1* | 4/2010 | Park ............. H04L 69/28 375/356 |
| 2010/0239252 | A1* | 9/2010 | Davis ............. H04Q 11/0067 398/58 |
| 2011/0296226 | A1* | 12/2011 | Sorbara ............. H04J 3/0685 713/400 |

\* cited by examiner

*Primary Examiner* — Obaidul Huq
(74) *Attorney, Agent, or Firm* — Patterson + Sheridan, LLP

(57) ABSTRACT

A method for measuring asynchronous timestamp requests includes receiving a timestamp ("TS") request from a client device during a first interval of a time of day ("TOD") clock, and calculating, using the TOD clock, at a next interval of the TOD clock, a TS correction of the TS request relative to a reference point of the first TOD clock interval. The method further includes adding the TS correction to the reference point of the first interval of the TOD clock, and outputting the corrected TS to the client device.

20 Claims, 8 Drawing Sheets

METHOD FOR TIME STAMPING WITH INCREASED ACCURACY

TECHNICAL FIELD

Embodiments of the present invention generally relate to time sampling in communication networks, and, in particular, to circuit architectures to sample the time of day (TOD) with high resolution.

BACKGROUND

Currently, the quality of many applications is directly related to the synchronization accuracy that may be achieved across a data network. For example, planned 5G Networks require better than 10 nanosecond (ns) accuracy top optimize network bandwidth and to improve the precision of location services. Or, for example, in power networks, the ability to locate faults is directly related to synchronization accuracy. In Stereo cameras, as another example, a synchronization error translates into an error in the estimated object position around, or relative to, a vehicle.

There are two main types of techniques in current use to achieve an accurate distribution of time of day (TOD) in geographically spread networks. A first family of techniques obtains TOD synchronization based on GNSS satellite networks such as, for example, GPS, Glonass, Galileo, Baidu, and the like. A second family of techniques utilizes packet based synchronization (as described in IEEE 1558).

It is noted that the accuracy of the IEEE 1588 is directly related to the precision at which a given system is able to measure link latency. Timestamps which are generated in the receive (Rx) direction use the recovered clock to sample the local time of day while timestamps in the transmit direction typically use the transmitter clock to sample the time of day federal system. The time of day clock is not locked to the RX or TX clocks; therefore, the residual precision of a timestamp is limited by the clock frequency at which the TOD evolves over time. As a matter of fact, the phase of the clock sampling the TOD changes at each timestamp generation.

Conventional solutions to address these problems may be classified in three different approaches. A first approach seeks to increase the frequency of the clock on which the TOD evolves. A second approach involves multiple phases of the TOD, where a clock can estimate where it is located inside the TOD clock period. Finally, a third approach involves locking the TOD to a client frequency, for example, an incoming frequency. In a multi-client application, for example, this requires synchronizing all of the clients. While the first two conventional approaches may achieve limited results, they do so at a cost of requiring a much more complex hardware installation. While the third approach generally solves the problem, it imposes a very stringent limitation as to which cases it may be applied to, as it requires synchronizing the entire network.

What is needed are improved circuits, systems and related methods to overcome the limitations of conventional solutions to timestamp accuracy.

SUMMARY

In one or more examples, methods for measuring asynchronous timestamp requests are described herein. In one example, a method for measuring asynchronous timestamp requests includes receiving a timestamp ("TS") request from a client device during a first interval of a time of day ("TOD") clock, and calculating, using the TOD clock, at a next interval of the TOD clock, a TS correction of the TS request relative to a reference point of the first TOD clock interval. The method further includes adding the TS correction to the first interval reference point of the TOD clock, and outputting the corrected TS to the client device.

In some examples, the reference point is a boundary of the first TOD clock interval.

In one or more examples, circuits to measure differences between two asynchronous timestamp requests, using only one clock tree, are presented. In one or more examples, such circuits are suitable for an FPGA implementation, and are able to achieve arbitrary precision. In one example, a circuit includes a single clock tree fed by a TOD clock, and a set of digital phase locked loops ("DPLLs"). Each DPLL includes an input interface configured to receive a timestamp ("TS") request from a client device during a first time interval of the TOD clock, a phase detector configured to detect a phase of a clock associated with the TS request, a numerically controlled oscillator ("NCO"), configured to receive the TS request and its phase and calculate a timestamp correction for the TS request relative to the TOD clock, and an output interface, configured to output the TS correction.

In another example, a circuit for calculating timestamp corrections includes a single clock tree fed by a first clock, and a set of DPLLs, each DPLL including an input interface configured to receive a TS request from a client device during a first interval of the first clock, a phase detector configured to detect a phase of a requesting device clock associated with the TS request, and an NCO, configured to receive the TS request and its phase and calculate a TS correction for the TS request relative to the first clock, and a subtractor, configured to receive the timestamp correction and a TOD clock correction, subtract the TOD clock correction from the TS correction, and output a normalized TS correction relative to a first interval of the TOD clock. The circuit further includes a TOD clock DPLL, including an input interface configured to receive a TOD clock signal, a phase detector configured to detect a phase of the TOD clock, and an NCO configured to receive the TOD clock signal and calculate a TOD clock correction between the TOD clock and the first clock, and an output interface, configured to output the TOD clock correction to each respective summer of the set of DPLLs.

BRIEF DESCRIPTION OF THE DRAWINGS

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

To facilitate understanding, identical reference numerals have been used, where possible, to designate identical elements that are common to the figures. It is contemplated that elements of one embodiment may be beneficially incorporated in other embodiments.

DETAILED DESCRIPTION

In one or more examples, TS precision may be arbitrarily improved using an example hardware structure that is suitable for either an FPGA or an ASIC implementation. In one or more examples, a circuit architecture to sample the TOD with high resolution, that is particularly useful in 5G networks, and in IEEE1588 aware networks in general, may be provided.

Figure 1:
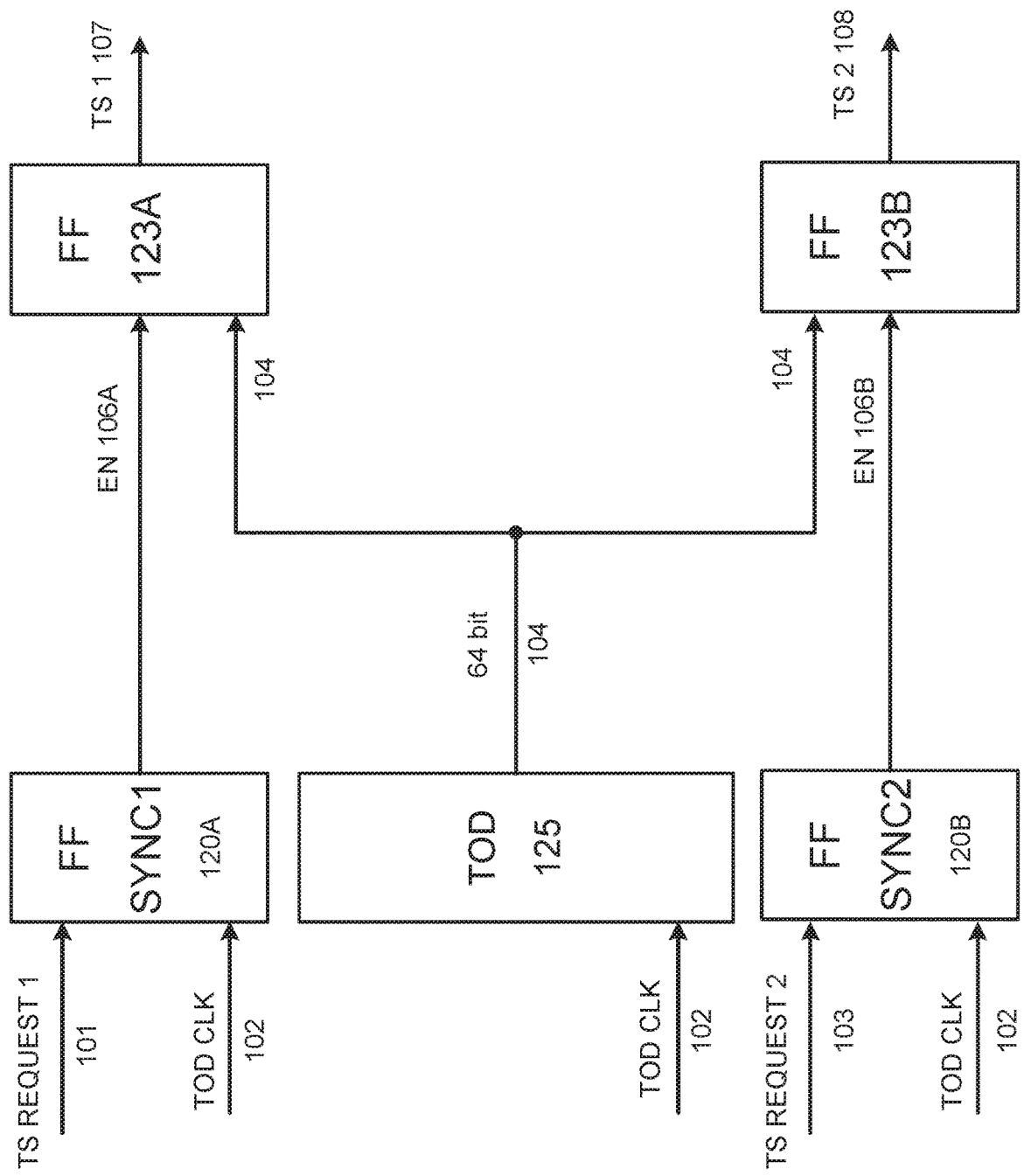
FIG. 1 illustrates TOD sampling errors in a conventional system architecture.

FIG. 1 illustrates TOD sampling errors in a conventional system architecture. With reference thereto, there are shown two timestamp ("TS") requests, TS request 1 101, and TS request 2 103. Each TS request is on its own local clock, which is the clock of the client device that sends the TS request. Each of the two TS requests 101, 102 are fed to a synchronization flip-flop, FF sync1 120A for TS request 1 101, and FF synch2 120B for TS request 2 103, as shown. Each of flip-flops 120A and 120B also take as inputs TOD clock 102. Thus, using TOD clock 102, FF sync1 120A outputs a signal EN 106A, which is a time stamp in response to the TS request 1 101, and FF sync2 120B outputs a signal EN 106B, which is a time stamp in response to the TS request 2 103. EN 106A and EN 106B are respectively clocked with TOD clock 102 to output timestamps TS 1 107, and TS 2 108, respectively. As illustrated and described with reference to FIG. 2 below, no matter when during a first interval of TOD clock 102 a TS request was received, the flip flops FF 123A and FF 123B output a corresponding time stamp responsive to the TS request at a pre-defined reference point of the next interval of the TOD clock. In some examples, such as in the example used in FIGS. 2 and 4, described below, the pre-defined reference point of the next interval of the TOD clock is the beginning of the next interval of the TOD clock, which, for example, occurs at a rising edge of the TOD clock.

Figure 2:
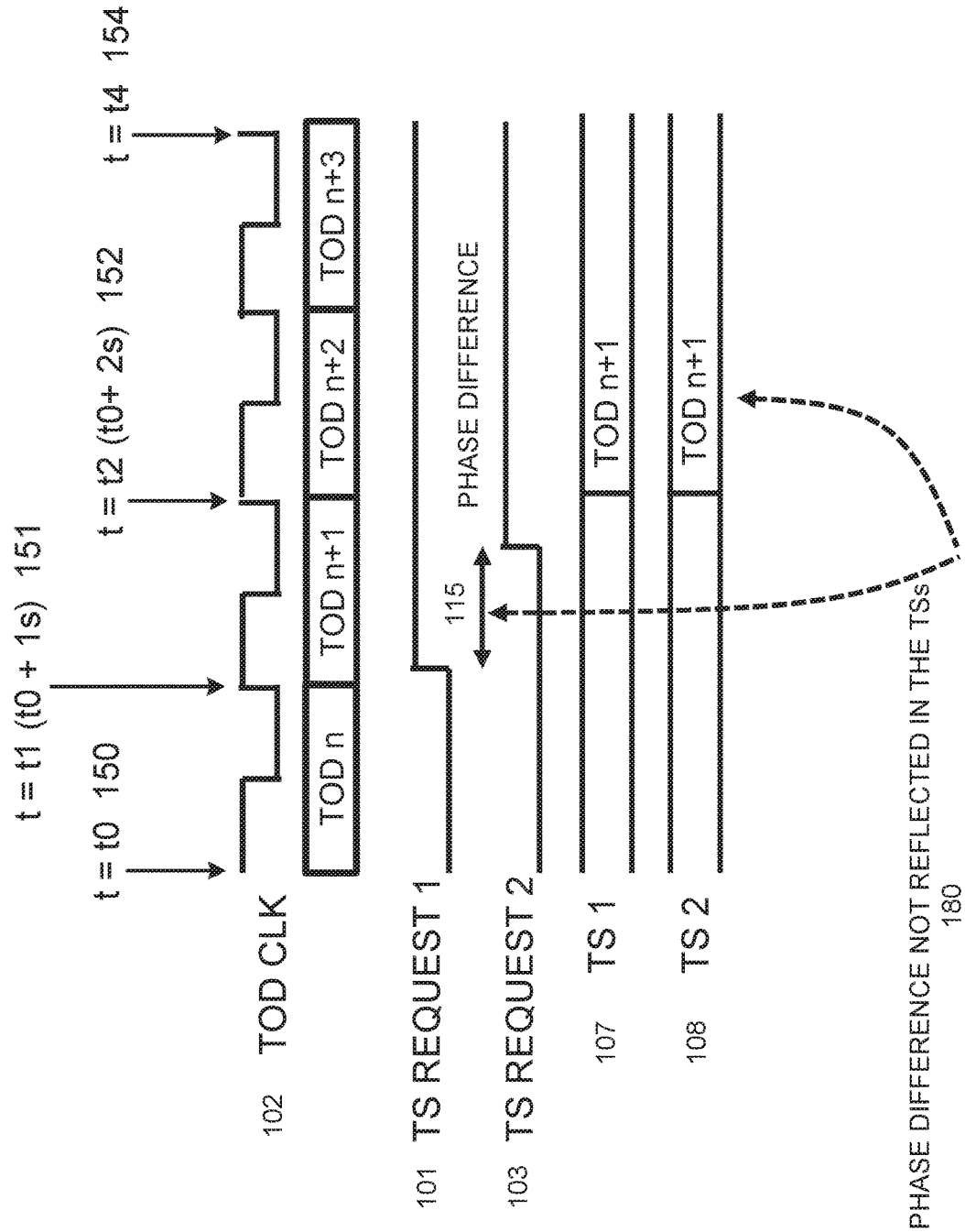
FIG. 2 depicts a timing diagram for the two timestamp requests illustrated in FIG. 1

Accordingly, FIG. 2 depicts a timing diagram 200 for the two example timestamp requests illustrated in FIG. 1. With reference to FIG. 2, there is shown, at the top of the figure, a TOD clock 102 which, as noted above, is independent of each of the client clocks on the basis of which the two timestamp requests, TS request 1 101 and TS request 2 102, were made. TOD clock 102 begins its intervals at a rising edge of the TOD clock, as shown. The timing diagram 200 also shows signal lines for each of TS request 1 101 and TS request 2 102, and also signal lines for the assertion of the timestamps themselves 107, 108. As is seen by inspection of the two TS request signal lines 101 and 103, there is a phase difference 115 between them, TS request 1 101 being considerably earlier in actual time (relative to TOD clock 102). As seen by inspection of FIG. 2, TS request 1 101 is almost a full TOD clock period earlier than TS request 2 103. However, as shown by signal lines TS 1 107 and TS 2 108, and as highlighted by comparison arrows 180, this temporal difference is not reflected in the timestamps. Thus, each of the two requests 101 and 103 results in a timestamp of TOD n+1, which is the TOD interval in which they were each received. It is here noted that, on each of their respective clocks, the client devices that send TS requests 1 and 2 assert the TS request signal only at the beginning of a clock period on their respective clocks. Thus, when one sees TS 1 coming at one point in TOD n+1, and then sees TS 2 coming in at a later point in TOD n+1, these time points are the beginning of a clock period on each local clock of the device sending the incoming TS request signal. Thus, phase difference 115 represents the phase difference between each client device's local clock in terms of the TOD clock 102.

It is noted that, for ease of description, the portion of the TOD clock 102 that is depicted in timing diagram 200 may be considered, as an example, to start at 12:00 noon, and that, for example, each interval of TOD clock 102 may be considered to be one second long. Thus, at t=t0 150, at the very beginning of the first time interval, TOD n, the TOD is 12:00 noon, and at t1 151, which is the beginning of the second interval TOD n+1, the time is t1 151=t0+1s, or 12:00:01 PM, and at t2 152, which is the beginning of the third TOD interval, TOD n+2, the time is t2=t0+2s, or 12:00:02 PM, and so on. Thus, at the end of the fourth and final depicted time interval, namely TOD n+3, at time t4 154, the time is 12:00:04. As shown, because both TS request 1 101, and TS request 2 102, each arrived sometime within the second TOD clock interval n+1, the time stamp for each of TS 1 107 and TS 2 108 is the same, namely TOD n+1, and this is assigned to each of them at the beginning of the third TOD clock interval, at t2, once the rising edge at the beginning of TOD n+2 occurs. Because this TS is a less precise TS, it may be known herein as a "coarse TS", in contrast to relative to a more precise TS according to one or more examples.

Thus, as noted above, all of the TS requests that are pending at the time of a clock transition (e.g., a rising edge of TOD CLK 102, at t2=t0+2s) are taken to have occurred during the prior TOD clock interval, without further precision. Thus, although the time of day noted in response to each of TS 1 107 and TS 2 108 is the same, namely TOD n+1, they actually differ by perhaps 0.8 of a full TOD period. Thus, in the illustrative example presented above, they differ by the time interval 115, which is about 0.8s. In a modern communications network, or in modern positional technologies, or, in general, in all modern synchronization technologies, where knowing the time of an event or a measurement (e.g., where an object is in front of a vehicle's cameras at a specific time) this is a significant discrepancy.

In the example of FIG. 2, each TOD clock interval begins at a rising edge, and thus at each of times t0, t1, t2, etc. In the example of FIG. 2, as noted, it is the beginning of the next TOD clock interval when a TS is issued for a TS request that was received anytime during the previous TOD clock interval. Thus, in the example of FIG. 2, both TS requests 101 and 103 are received during TOD clock interval TOD n+1, between times t1 151 and t2 152. And both responsive TSs 107 and 108 are issued at the beginning of the next clock interval, TOD n+2, at time t2 152.

It is noted that, in general, any point within a TOD clock interval may equivalently be used as a reference point for issuing TSs, such as a midpoint, a beginning, or an end of a TOD clock interval. Moreover, when generating corrections to the coarse TSs illustrated in FIG. 2, as described below, one may select a reference point for the corrections, and the correction is with reference to that reference point. Thus, if when generating a TS in clock interval TOD n+2, one uses the beginning of the prior TOD clock interval TOD n+1 as the correction reference point, e.g., t1 151, which is earlier than the TS requests, then the corrections are added to that time point to get the actual TSs. The corrections being the time interval between t1 and the actual time the TS request was received. Alternatively, if the end of the TOD clock interval is used (which is actually the beginning of the next TOD clock interval) as the correction reference point, e.g., t2 152 in FIG. 2, which is later than the TS requests, then the corrections are subtracted from the reference point t2, so as to "reach back" in time from t2, the beginning of TOD n+2, to sometime in the middle of the previous time interval TOD n+1, and the corrections are the time that elapsed between the receipt of the TS request and the time t2. Thus, in one or more examples the correction is applied to the discrete slot in which the transition (TS request) is detected. In general, the simple structure shown in FIG. 1 detects only the slot where the TS requests happen, but does not know where inside the slot it exactly is. In one or more examples, the exact position in the slot may be understood, and presented to a user as part of the TS. As noted above, the correction may be added or removed (depending on implementation) to increase the resolution of the system.

Thus, the example conventional system shown in FIG. 1 generates only coarse values for TS1 and TS2, valid only to within one TOD CLK interval. To address this lack of precision, the sample circuit shown in FIG. 3 generates appropriate corrections, thereby locating the TS at its true point within the previous TOD clock interval, in accordance with one or more examples. This enhanced circuit architecture of FIG. 3 is next described.

Figure 3:
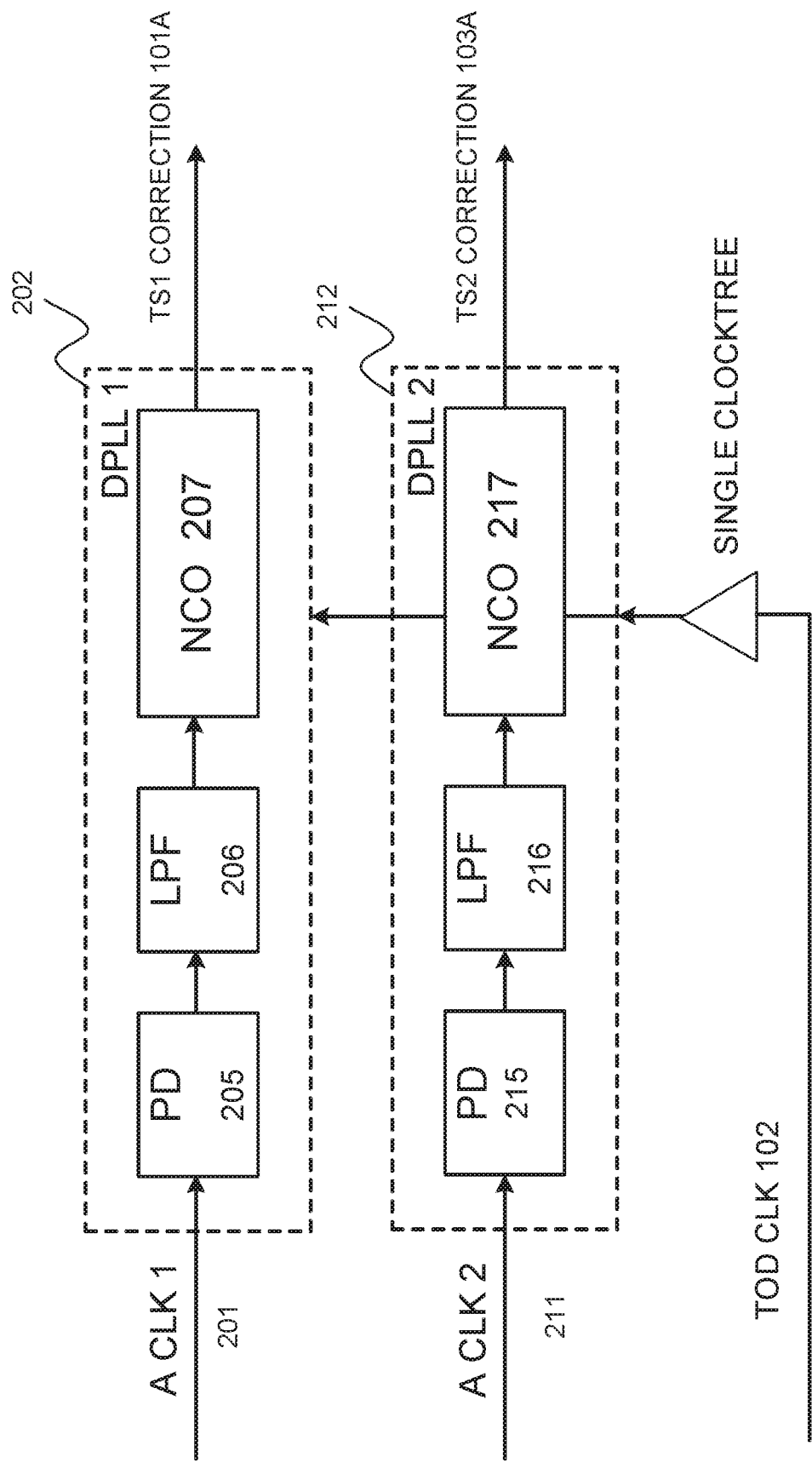
FIG. 3 illustrates an example system for measuring the time difference between two timestamp requests, according to an example.

With reference to FIG. 3, two example timestamp requests, being TS request 1 101 and TS request 2 102, are generated on local clocks A clock 1 201 and A clock 2 211, respectively. These two local clocks are completely asynchronous with respect to TOD clock 102, as well as with each other, and, in general, they may be recovered clocks from different clients. It is here noted that all of these clocks may be at completely different frequencies, as opposed to merely differing by a small amount, such as, for example, only a few parts per million.

Continuing with reference to FIG. 3, TOD clock 102 is the only clock tree, as shown, and thus it is TOD clock 102 that clocks both of the digital phase locked loops ("DPLLs"), namely DPLL 1 202 and DPLL 2 212. Each DPLL includes a respective phase detector ("PD") 205, 215, low pass filter ("LPF") 206, 216, and a numerically controlled oscillator ("NCO") 207, 217. Each DPLL is locked to its respective recovered clock, namely A CLK 1 201 for DPLL 1 202, and A CLK 2 211 for DPLL 2 212, respectively. As soon as a TS request comes in (not shown in FIG. 3, but it is what is on each of the A CLK 1 and A CLK 2 signal lines), whether it is on the first channel, the second channel, or both, that timestamp request will be synchronized by the circuitry of FIG. 3 to TOD CLK 102, and the resulting timestamp corrections recorded It is these corrections that may be added to the timestamp that refers to the previous TOD clock period, e.g., TOD n+1 in FIG. 2, in one or more examples.

In one or more examples, the correction may be relative to any edge, and this is implementation dependent. The correction is to be added or subtracted accordingly. For implementation reasons, the correction can be referred also to many edges before or after the TS request. When applying the correction, this information is included in the correction. Thus, for example, if the boundary of a TOD clock interval is, for purposes of setting a TS, taken as the beginning of a previous clock period of the TOD clock, such as at time t1 151 for clock period TOD n+1, then the corrections are relative to the beginning of clock period TOD n+1, and the correction is equivalent to the time interval between t1151 and when the TS request was received, and the corrections are added to the coarse TS. In one or more examples, this may be determined by adding (1—{the TS correction}) to the time of the beginning of the TOD clock period during which the TS request was received.

Or, alternatively, for example, if the boundary of a TOD clock interval is, for purposes of setting a TS, taken to be the end of a previous clock interval of the TOD clock, such as at time t2 152 for clock period TOD n+1, then the TS corrections are relative to the time t2 152, and the TS correction is equivalent to the time interval between when the TS request was received and t2. In this alternate example the corrections are subtracted from the coarse TS, so as to "reach back" in time from t2, to the actual time the TS request was received during the TOD n+1 clock interval.

Thus, in one or more examples, the TS 1 correction 101A will be used to define where exactly inside a given TOD CLK period the TS REQUEST 1 was received. Similarly, for TS 2, the TS 2 correction 103A will be used to define where exactly inside a given TOD CLK period the TS REQUEST 1 was asserted.

As noted, the conventional circuit as depicted in FIG. 1 generates only coarse values for TS 1 and TS 2, and the circuit as depicted in FIG. 3, in one or more examples, generates the appropriate corrections. In one or more examples, the TS corrections calculated from the example architecture depicted in FIG. 3 may be used to "upgrade" the example architecture depicted in FIG. 1. This is next described with reference to FIG. 4.

Figure 4:
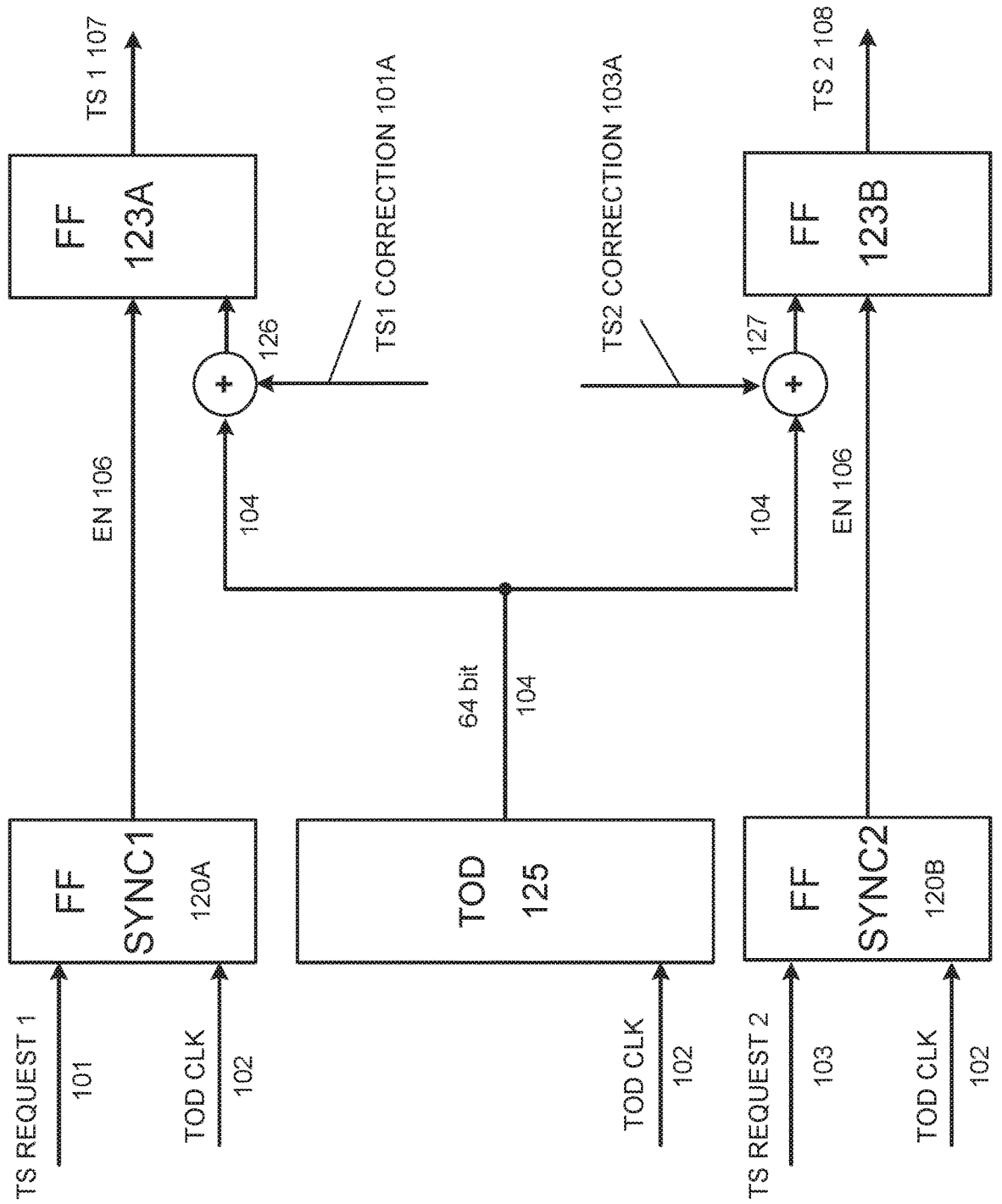
FIG. 4 illustrates an enhanced system architecture that includes the timestamp corrections illustrated in FIG. 3, according to an example.

FIG. 4 illustrates an enhanced system architecture that includes timestamp corrections as illustrated in FIG. 3, according to an example. The architecture depicted in FIG. 4 is the same as that shown in FIG. 1, with the exception of two additions. Thus, having previously described FIG. 1, only the two additions that appear in FIG. 4 will be described. With reference to FIG. 4, there are added to the architecture of FIG. 1 two summers, summer 126 and summer 127. Each summer receives two inputs, namely the TOD clock signal 104, and a TS correction. Thus, in particular, on the top of FIG. 4, regarding a first channel, summer 126 adds the TOD clock signal 104 to the TS1 correction 101A. TS1 correction 101A is calculated, for example, using the enhanced circuitry presented in FIG. 3. Thus, the output of summer 126 is the corrected TS for TS request 1, according to one or more examples. Similarly, at the bottom of FIG. 4, regarding a second channel, summer 127 adds the TOD clock signal 104 to the TS2 correction 103A. TS2 correction 103A is calculated, for example, using the enhanced circuitry presented in FIG. 3. Thus, the output of summer 127 is the corrected TS for TS request 2, according to one or more examples. A timing diagram, similar to that of FIG. 2, but augmented to illustrate the enhanced system architecture of FIG. 4, is presented in FIG. 5. This is next described.

Figure 5:
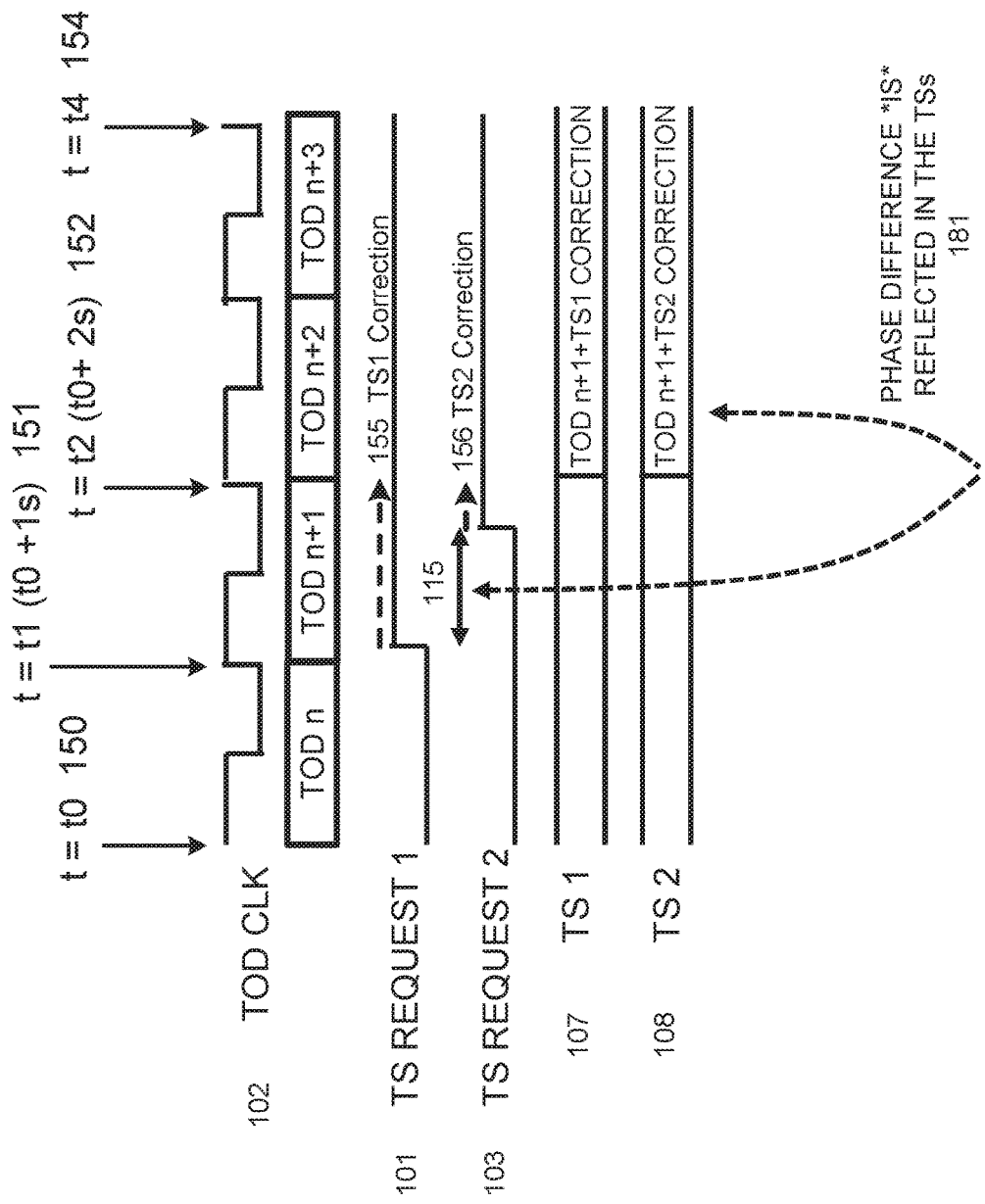
FIG. 5 depicts a timing diagram for the enhanced system architecture of FIG. 4.

FIG. 5 depicts a timing diagram 500 for the example enhanced system architecture of FIG. 4, according to one or more examples. With reference thereto, the timing diagram 500 of FIG. 5 is essentially the same as timing diagram 200 of FIG. 2, with some additions. Thus, only those additions will be described. Continuing with reference to FIG. 5, there are shown the actual time intervals 155 and 156, relative to the TOD clock 102, between the respective assertion of each of TS request 1 101 and TS request 2 102, and the end of the clock interval TOD n+1 at t2. In one or more examples, a TS request coming in from a client device is asserted high, and the assertion is at the beginning of a local clock interval of the respective local clock of the client device. Because the local clocks are each asynchronous to TOD clock 102, there is a quantifiable time interval between the assertion of TS1 and t2, which is shown in FIG. 5 as time interval 155. Similarly, there is also a quantifiable time interval between the assertion of TS2 and t2, which is shown in FIG. 5 as time interval 156. In one or more examples, there may be more client devices than two, each sending TS requests to, for example, the system architecture of FIG. 4. Thus, there may be several TS requests received within a given TOD clock interval, more than the two as illustrated in FIG. 5. Thus, in one or more examples, each of N TS requests will have an associated TSK correction calculated, where K is an integer between 1 and N, in the same manner as TS1 correction 155, and TS2 correction 156, are calculated, as shown in FIG. 5. In one or more examples, the TSK corrections are respectively added to a boundary of a TOD clock interval, as shown, to generate a corrected TS, and thus the phase difference between any two TS requests is, in fact, reflected in the final TSs, as indicated by comparison arrows 181. In one or more examples, given the various TSN corrections, differences in phase between all of the final TSs are reflected.

As regards resolution between any two TSs, this is related to the frequency difference between the TOD clock and the local client device clocks that are generating the TS requests. For example, if they differ by 1 ppm, then one may achieve $10^{-6}$ of the TOD clk. If they are locked (0 ppm difference), then there is no correction. That is the reason why, in general, the system of FIG. 4 (an implementation where TOD CLK is simply unlocked) will work for most cases. If, however, a given system forces the TOD CLK to be locked, then one may use an additional clock that is known to be unlocked. This is covered by the example illustrated in FIG. 6, described below which presents a more complete embodiment, for the most general case.

In FIG. 5 the TSs are calculated correctly, as they include the correction. However, the information for each TS is available only on the first edge of the following TOD clock, when thus both TS requests have already been sent. The corrections are always relative to TOD CLK, which is the common reference. As noted above, in one or more examples, the correction can be added to the TOD clock rising edge prior to the TS request, or, for example, subtracted from the first edge after the TS request has been received. In general this is implementation dependent, and either approach is doable. Based on how the correction is generated (the correction is a number), it is used it to correct the "coarse" information about the TS position coming from the simple scheme as shown in FIG. 1. Thus, with reference to FIG. 4, that is what occurs at each of FF 123A and FF 123B, which each store a number, and thus output the "fine tuned" TS 1 107 and TS 2 108, which are now no longer the same time value.

Figure 6:
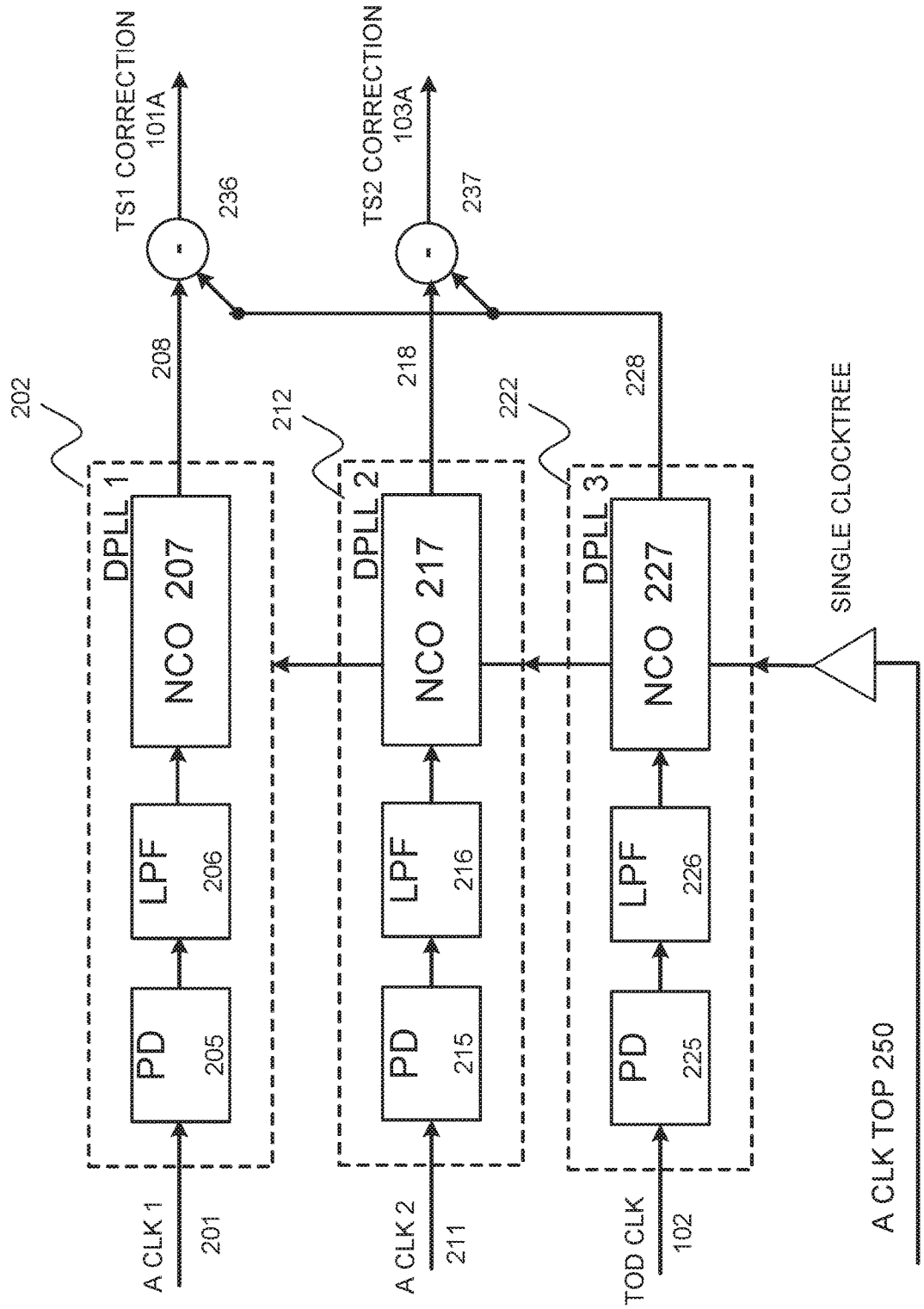
FIG. 6 illustrates an alternate example system for measuring the time difference between two timestamp requests, according to an example.

FIG. 6 illustrates an alternate example system architecture for measuring the time difference between two TS requests, according to an example. FIG. 6 is a modified version of the enhanced system architecture of FIG. 3. The reasons behind the alternate example system architecture of FIG. 6 are as follows. Ideally each A CLK N that originates on a client device, e.g., A CLK 1 201 and A CLK 2 211, is asynchronous to the TOD CLK 102, so as to allow locking the NCO with high resolution. While this is typically the case, there may be network architectures where a TOD CLK 102 happens to be synchronous with at least one of the client device A CLKs 201, 211. For such an eventuality, the alternate example of FIG. 6 addresses this problem.

Thus, the NCO will lock with high resolution only if the clock moving the NCO is asynchronous to the clocks coming from the client devices. While this is typically the case, for some network architectures this is not true. The example illustrated in FIG. 6 simply uses an additional clock, (A CLK TOP 250), known to be asynchronous, so as to allow the NCOs to operate at high resolution.

Thus, in the alternate example of FIG. 6, an additional local clock available on, for example, a local system board (on which the example system architecture is implemented), is utilized. This new clock is shown as A CLK TOP 250 in FIG. 6. It is this additional local clock that supplies the single clocktree that feeds all three DPLLs including DPLLs 202 and 212, as well as an additional example DPLL, DPLL 3 222, that locks the TOD CLK 102 to its own NCO 227. Thus, continuing with reference to FIG. 6, there is a third DPLL, DPLL 3 222, that includes PD 225, LPF 226 and NCO 227. DPLL 3 222, via PD 225, receives the clock signal from the TOD CLK 102, and locks it to the new local clock, A CLK TOP 250, outputting a phase difference 228 between TOD CLK 102 and A CLK TOP 250.

The other incoming TS requests are also locked to A CLK TOP 250, as shown. Moreover, the output 228 of DPLL 3 222, which, as noted, is the phase difference between TOD CLK 102 and the A CLK TOP 250, is subtracted from each of the intermediate outputs 208, 218 of the respective DPLLs 202, 212 that receive the client device A CLKs. Thus, DPLL 3 222's clock phase difference output 228 is subtracted from the intermediate output 208 of DPLL 1 202, which is the intermediate TS correction between A CLK 1 201 and A CLK TOP 250, at subtractor 236, to generate TS1 correction 101A, and DPLL 3 222's clock phase difference output 228 is also subtracted from intermediate output 218 of DPLL 2 212, which is the intermediate TS correction between A CLK 2 211 and A CLK TOP 250, at subtractor 237, to generate TS2 correction 103A. Similarly, in the example architecture of FIG. 6, any intermediate outputs (e.g., intermediate TS corrections) of any other DPLLs that may be used to synchronize other client device clocks A CLK K (none shown in FIG. 6), according to which additional TS requests on respective A CLKs are received, would each also be fed to a subtractor and normalized by subtracting output 228 from the respective intermediate TS correction.

Conceptually, it is noted, if two clocks are locked, there is no way for one to understand the exact phase of the other one. However, if the two clocks are sliding (i.e., asynchronous to each other), one will periodically see the edge of the other clock.

In one or more examples, the new local clock A CLK TOP 250 can be easily selected to be asynchronous to all of the client device recovered clocks, e.g., A CLKs 201, 211, as well as to the TOD CLK 102. Thus, in the example of FIG. 6, all incoming TS requests are synchronized to A CLK TOP 250, and no longer to TOD CLK 102, as in the example of FIG. 4. Thus, the example system architecture of FIG. 6 can be seen as a more general embodiment, which includes the simpler case of FIG. 4 where it is assumed that each A CLK 201, 211, etc., is asynchronous with TOD CLK 102.

It is noted, for clarity, that in both the examples of FIGS. 3 and 6 the TSs are calculated using the TOD CLK as a reference. In the embodiment of FIG. 3 this is done directly, as described above. However, in the embodiment of FIG. 6, this is done in two steps. First each TS request is measured relative to the TOP CLK 250 to generate an intermediate output, or an intermediate TS correction. At the same time, in a second operation, the phase of TOP CLK 250 is measured against that of the TOD CLK 102, so that the TSs may be ultimately measured versus the TOD CLK 102. As shown in FIG. 6, this second measurement is captured by the subtractors 236 and 237, which are not present in the embodiment of FIG. 3. Thus, with reference to FIG. 6, one may say that we first calculate the various TSs relative to TOP CLK 250 only as an intermediate step, as the final goal is to calculate the TSs relative to the TOD CLK 102.

The structure illustrated in FIG. 6, as well as its simplified version that is illustrated in FIG. 3, are each very suitable for FPGA or ASIC implementation, as they use just one clock-tree, independently of how many clients a given user needs to time stamp. It is noted that while the examples described above generally illustrate the case for a received TS request, in one or more examples, the structure for the transmit (Tx) direction may be obtained by connecting an A CLK to the clock that loads the data into the transmitter.

Figure 7:
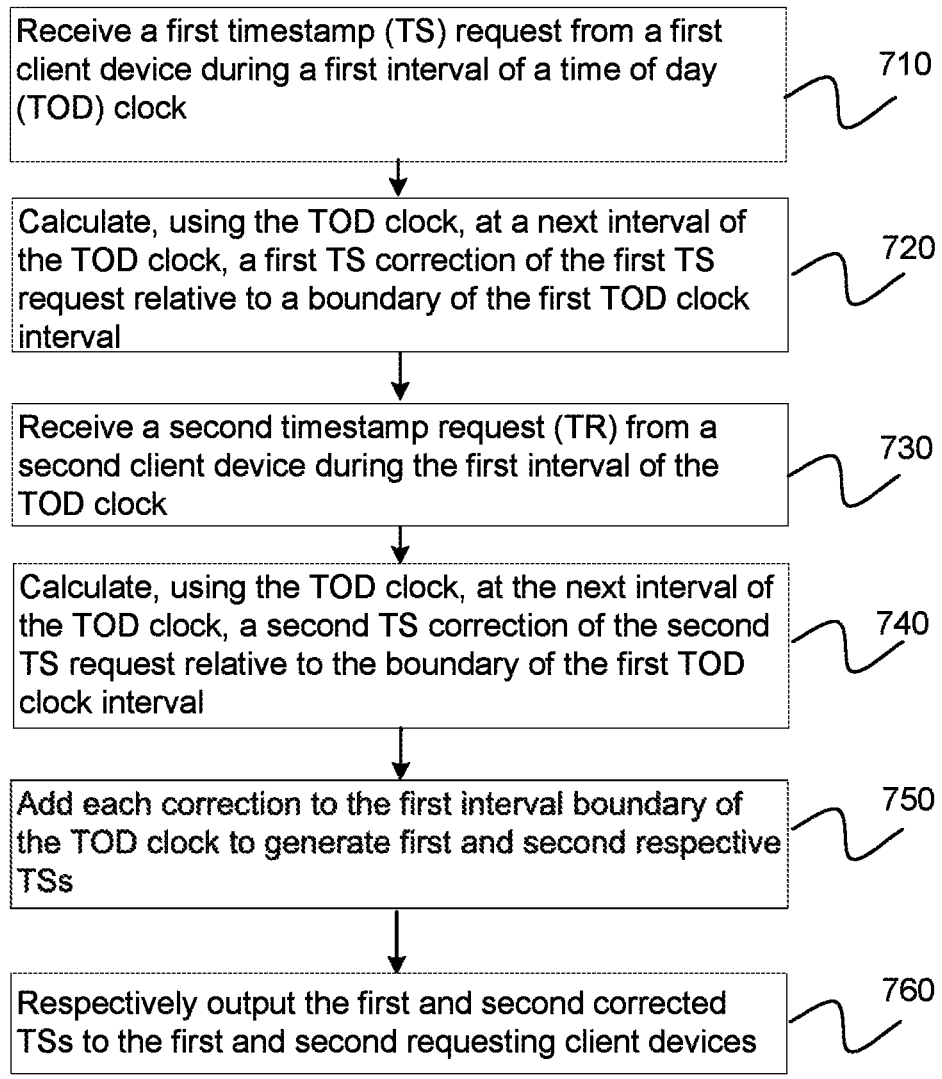
FIG. 7 is a flow diagram of a method for correcting timestamps, according to an example.

FIG. 7 is a flow diagram of a method for correcting timestamps, according to an example. Method 700 includes blocks 710 through 760. In alternate examples, method 700 may include greater, or fewer, blocks. Method 700 begins at block 710 where a first timestamp (TS) request is received from a first client device during a first interval of a time of day (TOD) clock. For example, the request may be TS Request 1 101 of FIG. 5.

From block 710, method 700 proceeds to block 720, where using the TOD clock, at a next interval of the TOD clock, a first TS correction of the first TS request relative to a boundary of the first TOD clock interval, is calculated. For example, the correction may be TS 1 correction as shown in the TS 1 signal line 107 of FIG. 5.

From block 720, method 700 proceeds to block 730, where a second TS request from a second client device is received during a first interval of a time of day (TOD) clock. For example, the request may be TS Request 2 103 of FIG. 5.

From block 730, method 700 proceeds to block 740, where, using the TOD clock, at a next interval of the TOD clock, a second TS correction of the second TS request relative to a boundary of the first TOD clock interval, is calculated. For example, the correction may be TS 2 correction as shown in the TS 2 signal line 108 of FIG. 5.

From block 740, method 700 proceeds to block 750, where each TS correction is added to the first interval boundary of the TOD clock to generate first and second respective TSs. For example, the first interval boundary of the TOD clock may be the rising edge at time =t1 151 in FIG. 5, and the TS1 and TS2 corrections may be each added to TOD n+1 (t1), to respectively yield TOD n+1+TS1 correction and TOD n+1+TS2 correction, as shown in FIG. 5.

From block 750, method 700 proceeds to block 760, where the first and second corrected TSs are respectively output to the first and second requesting client devices. Method 700 terminates at block 760.

Figure 8:
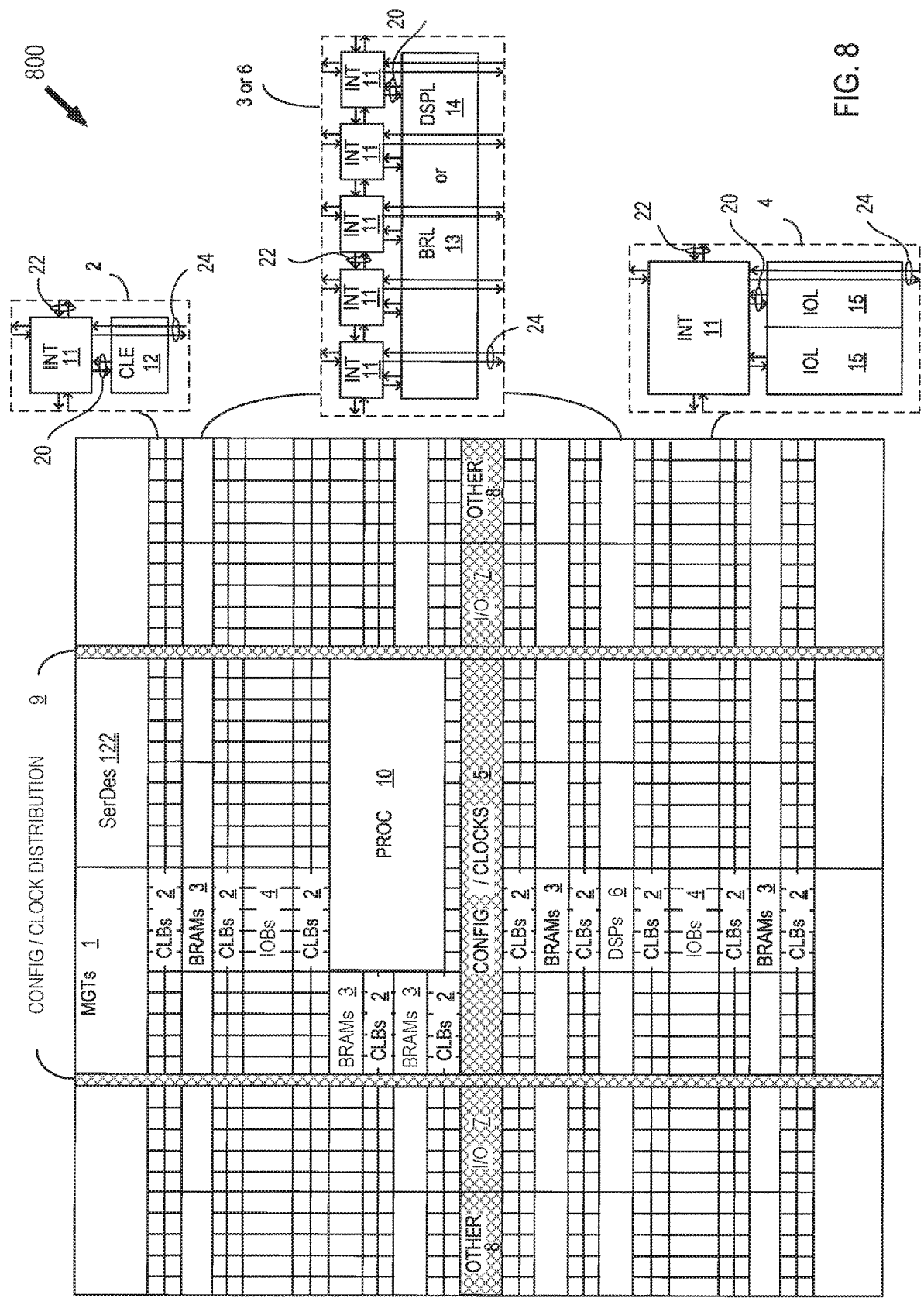
FIG. 8 is a schematic diagram of a field programmable gate array (FPGA) architecture in which techniques described herein can be employed.

FIG. 8 illustrates an example FPGA architecture that may be used to implement either the system architecture of FIGS. 3 and 4, or the more general system architecture of FIG. 6. With reference to FIG. 8, FPGA 800 includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10. FPGA T800 can include one or more instances of the system architecture of either of FIG. 3 and 4 or 6, described above.

In some FPGAs, each programmable tile can include at least one programmable interconnect element ("INT") 11 having connections to input and output terminals 20 of a programmable logic element within the same tile, as shown by examples included at the top of FIG. T8. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An IOB 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 8) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

It is noted that FIG. 8 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 8 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Thus, the example architectures described above allow for arbitrarily improving the TS precision with a hardware structure that is suitable for either an FPGA or an ASIC implementation. Previously attempted solutions only offer a limited improvement of the TS accuracy at the cost of a much more complex hardware.

Various examples according to the present disclosure may be implemented in an FPGA fabric, and are thus not restricted to using any specific hardware block.

While the foregoing is directed to embodiments of the present invention, other and further embodiments of the invention may be devised without departing from the basic scope thereof, and the scope thereof is determined by the claims that follow.

What is claimed is:

1. A method for timestamping in electronic devices, comprising:
   receiving a timestamp ("TS") request from a client device during a first interval of a time of day (TOD) clock, the TS request based on a first local clock of the client device, the TOD clock remote from the client;
   calculating, using the TOD clock, at a next interval of the TOD clock, a TS correction of the TS request relative to a reference point of the first interval of the TOD clock;
   adding the TS correction to the reference point of the first interval of the TOD clock to define a position of the TS request inside of a TOD clock interval; and
   outputting a corrected TS to the client device.

2. The method of claim 1, further comprising:
   receiving one or more additional TS requests from at least one client device during the first interval of the TOD clock, the one or more additional TS requests based on one or more additional local clocks different than the first local clock and the TOD clock;
   for each additional TS request:
      calculating, using the TOD clock, at a next interval of the TOD clock, a TS correction of the TS request relative to the reference point of the first interval of the TOD clock;
      adding the TS correction to the reference point of the first interval of the TOD clock to define a position of the TS request inside of a TOD clock interval; and
      outputting a corrected TS to the client device.

3. The method of claim 2, wherein the TS request and the one or more additional TS requests are respectively sent, by respective client devices, relative to a respective local clock, and wherein none of the local clocks are synchronous with the TOD clock.

4. The method of claim 1, wherein the reference point of the first interval is a boundary of the first interval of the TOD clock.

5. The method of claim 3, wherein the boundary of the first interval of the TOD clock is a rising edge of the TOD clock.

6. The method of claim 5, wherein calculating the TS correction further comprises calculating a time interval between receipt of the TS request and a next rising edge of the TOD clock ("TS offset").

7. The method of claim 6, wherein adding the TS correction to the boundary of the first interval of the TOD clock includes subtracting the TS offset from the boundary of the next interval of the TOD clock.

8. The method of claim 6, wherein adding the TS correction to the boundary of the first interval of the TOD clock includes adding a period of the TOD clock less the TS offset to the boundary of the first interval of the TOD clock.

9. The method of claim 1, wherein the reference point of the first interval of the TOD clock is a falling edge of the TOD clock.

10. The method of claim 1, wherein the TS request is sent relative to the first local clock of the client device, the first local clock being asynchronous to the TOD clock.

11. A circuit for calculating timestamp corrections, comprising:
   a single clock tree fed by a time of day (TOD) clock; and
   a set of digital phase locked loops ("DPLLs"), each DPLL including:
      an input interface configured to receive a timestamp ("TS") request from a client device during a first interval of the TOD clock;
      a phase detector configured to detect a phase of a clock associated with the TS request;
      a numerically controlled oscillator ("NCO"), configured to receive the TS request and its phase and calculate a TS correction for the TS request relative to the TOD clock; and
      an output interface, configured to output the TS correction.

12. The circuit of claim 11, further comprising a low pass filter coupled between the phase detector and the NCO, the low pass filter configured to accurately identify a frequency of an incoming TS request signal.

13. The circuit of claim 11, wherein each TS correction is relative to a reference point of either the first interval of the TOD clock or a next interval of the TOD clock.

14. The circuit of claim 13, wherein the reference point is a boundary of the first interval of the TOD clock.

15. The circuit of claim 14, wherein the boundary of the first interval of the TOD clock is an initial rising edge of the first interval of the TOD clock.

16. The circuit of claim 13, wherein the reference point is a boundary of the next interval of the TOD clock, and wherein the boundary is an initial rising edge of the TOD clock in the next interval of the TOD clock.

17. The circuit of claim 11, wherein calculating the TS correction for the TS request relative to the TOD clock further comprises calculating a time interval between receipt of the TS request and a next rising edge of the TOD clock.

18. The circuit of claim 17, further comprising, for each DPLL in the set, a flip-flop configured to receive the TS correction and add it to a low-resolution TS generated in response to the TS request.

19. The circuit of claim 18, wherein the low-resolution TS comprises a beginning of the first interval of the TOD clock, and wherein each flip-flop is further configured to output a high resolution TS that specifies a point within the first interval of the TOD clock.

20. A circuit for calculating timestamp corrections, comprising:
- a single clock tree fed by a first clock;
- a set of digital phase locked loops ("DPLLs"), each DPLL including:
  - an input interface configured to receive a timestamp ("TS") request from a client device during a first interval of the first clock;
  - a phase detector configured to detect a phase of a requesting device clock associated with the TS request;
  - a numerically controlled oscillator ("NCO") configured to receive the TS request and its phase and calculate a TS correction for the TS request relative to the first clock; and
  - a subtractor configured to receive the TS correction and a time of day (TOD) clock correction, subtract the TOD clock correction from the TS correction, and output a normalized TS correction relative to a first interval of the TOD clock; and
- a TOD clock DPLL, including:
  - an input interface configured to receive a TOD clock signal;
  - a phase detector configured to detect a phase of the TOD clock;
  - a numerically controlled oscillator ("NCO") configured to receive the TOD clock signal and calculate a TOD clock correction between the TOD clock and the first clock; and
- an output, interface configured to output the TOD clock correction to each respective subtractor of the set of DPLLs.

* * * * *